United States Patent [19]

Kaplan

[11] Patent Number: 6,081,118
[45] Date of Patent: Jun. 27, 2000

[54] RAPID HIGH-ACCURACY MAGNETIC RESONANCE IMAGING

[76] Inventor: Jerome I. Kaplan, 4417 N. Pennsylvania, Indianapolis, Ind. 46205

[21] Appl. No.: 09/056,518

[22] Filed: Apr. 7, 1998

[51] Int. Cl.[7] .................................................. G01V 3/00
[52] U.S. Cl. ......................................... 324/307; 324/309
[58] Field of Search ................................. 327/307, 309, 327/500

[56] References Cited

U.S. PATENT DOCUMENTS

| Re. 33,259 | 7/1990 | Crooks et al. | 324/309 |
|---|---|---|---|
| Re. 35,656 | 11/1997 | Feinberg et al. | 324/309 |
| 4,307,343 | 12/1981 | Likes | 324/307 |
| 4,383,219 | 5/1983 | Kaplan | 324/309 |
| 4,642,567 | 2/1987 | Kaplan | 324/309 |
| 5,271,654 | 12/1993 | Feinberg et al. | 324/300 |
| 5,422,576 | 6/1995 | Kao et al. | 324/309 |

OTHER PUBLICATIONS

Deconvolution of Images and Spectra (pp. iii–xiv, 1–41 and 76–113), Peter A. Jansson, Academic Press, San Diego, 1984.

Spatial Encoding and Image Reconstruction, Stephen J. Riederer, 1992 AAPM Summer School Proceedings, American Institute of Physics, 1992.

Processing Images in Frequency Space (pp. 331–341) & References (pp. 659–668), The Image Processing Handbook, 2nd Edition, John C. Russ, CRC Press, Boca Raton, 1995.

Echo–Planar Imaging (pp. 141–147), Franz Schmitt, Michael K. Stehling & Robert Turner, Springer–Verlag, Berlin 1998.

(List continued on next page.)

Primary Examiner—Christine K. Oda
Assistant Examiner—Brij B. Shrivastav
Attorney, Agent, or Firm—Laurence J. Shaw

[57] ABSTRACT

Method and apparatus for increased accuracy of an image of object density pixel values obtained by forming linear combinations thereof. A measured variable M is related to an integration of the actual object density $\rho$ over space q by a transform function F, i.e., $M(t)=\int F(t, q)\rho(q)dq$, and an estimated object density $\rho^*$ is obtained by an approximate inversion of the transform function, i.e., $\rho^*(q)=\Sigma E(t,q)M(t)$, where the sum is over the samples taken. (In the case of magnetic resonance imaging, M is the magnetization induced in a coil transverse to the main magnetization coil, the transform function $F(t,q)$ includes sinusoidal components, and the inversion function G includes an inverse Fourier transform.) Therefore, the estimated object density $\rho^*$ is related to the actual object density $\rho$ by $$\rho^*(q)=\int \Sigma E(t,q)F(t,q')\rho(q')dq',$$

and $\Sigma E(t,q)F(t,q')$ is termed the kernel $A(q,q')$. Due to the limited number of samples, the kernel A only approximates the delta function $\delta(q-q')$, and values of $\rho(q)$ away from $q=q'$ contribute to $\rho^*(q')$. By defining the (i,j) element of a matrix B as $\int A(q)dq$, where the integration is taken over a spatial grid element centered about position $(q_i-q_j)$, the relationship between the estimated object density $\rho^*$ and the actual object density $\rho$ is approximated by a matrix equation $\rho^*(q_i)=B_{ij}\rho(q_j)$. A matrix G is determined such that $G*B=H$, where $H_{0,0}=1$ and all other elements are zero, and an improved-accuracy object density $\rho^{}$ is obtained from linear combinations of the estimated object density according to the relation $\rho^{}(q_i)=G_{ij}\rho^*(q_j)$. According to another aspect of the present invention, the data acquisition time is made short enough that the position dependence of the spin-spin relaxation time $T_2$ can be ignored. According to still another aspect of the present invention, the magnetic field gradients are continuously varied during data acquisition in a manner such that the functions $f_1(t)$ and $f_2(t)$, which are proportional to the first time integral of the magnetic field gradients along the x- and y-axes, respectively, essentially sample one and only one quadrant of $f_1$-$f_2$ phase space.

15 Claims, 7 Drawing Sheets

OTHER PUBLICATIONS

NMR—A perspective on imaging, General Electric, (pre. 1989).

NMR imaging in theory and in practice (Sections 2–5 & References, pp. 635–670), D.G. Taylor, R. Inamdar & M–C. Bushell, Phys. Med. Biol., vol. 33, No. 6, IOP Publishing Ltd. U.K., 1988.

Prolongation of Proton Spin Lattice Relaxation Times in Regionally Ischemic Tissue from Dog Hearts, E.S. Williams, J.I. Kaplan, F. Thatcher, G. Zimmerman & S.B. Knoebel, Journal of Nuclear Medicine, vol. 21, No. 5, pp. 449–453, 1980.

Parameters Determining the Appearance of NMR Images (pp. 81–82 and 99–103), F.W. Wehrli, J.R. MacFall & T.H. Newton, General Electric, 1984.

Image Restoration Models (Chapter 13, pp. 345–377), Digital Image Processing, William K. Pratt, John Wiley & Sons, New York, 1978.

Magnetic resonance imaging in cardiology: current status and perspectivess, Francesco Fedele, Paolo Di Renzi, Ernesto Di Cesare, Cardiologia (pp. 595–611), vol. 41 (7), 1996.

RAPID HIGH-ACCURACY MAGNETIC RESONANCE IMAGING

BACKGROUND OF THE INVENTION

The present invention is directed to magnetic resonance imaging (MRI) apparatus and methods, and particularly to apparatus and methods which increase the accuracy and/or resolution of MRI images, and/or decrease the time required to obtain an MRI image.

MRI is based on solving the Bloch Equations $$dM_x/dt = -\gamma H_z M_y - M_x/T_2, \quad (1.3.3)$$

$$dM_y/dt = -\gamma H_z M_x - M_y/T_2, \quad (1.3.2)$$

and $$dM_z/dt = -(M_0 - M_z)/T_1, \quad (1.3.3)$$

which gives the magnetization $M = M_x x + M_y y + M_z z$ of magnetic nuclei (typically protons) in the presence of a magnetic field $H = H_z z$. Standard nuclear magnetic resonance (NMR) uses a homogeneous magnetic field, but to obtain the spatial resolution required for image mapping, gradient magnetic fields must be added. The interaction of the magnetic spins with the environment is given in terms of the transverse relaxation time $T_2$ which determines the rate of decay of the $M_x$ and $M_y$ components of the magnetization M to zero, and the longitudinal relaxation time $T_1$ which determines the rate of decay of the $M_z$ component of the magnetization M to the value $M_0$. It has been previously shown (Prolongation of Proton Spin Lattice Relaxation Times in Regionally Ischemic Tissue from Dog Hearts, E. S. Williams, J. I. Kaplan, F. Thatcher, G. Zimmerman and S. B. Knoebel, Journal of Nuclear Medicine, May 1980, Vol. 21, No. 5) that $T_1$ is different in normal and ischemic heart muscle by about 10%. Using the inversion recovery technique" (which is described in detail in U.S. Pat. No. 4,383,219, entitled Nuclear Magnetic Resonance Spatial Mapping, issued May 10, 1983 to Jerome I. Kaplan, and is incorporated herein by reference) the 10% difference in the relaxation times can be amplified into a 25% differentiation in the magnetization in the normal and ischemic regions of the heart. Thus mapping this difference in magnetization allows for a mapping of the normal and ischemic regions of the heart.

High-resolution MRI images of non-moving body parts are routinely obtained. However, an added difficulty with the heart arises from its large scale rapid motion (1 beat/second). To avoid blurring the MRI image must be obtained in less than 1/20th of a second.

As is shown in the present specification, standard mapping procedures do not permit a high-resolution for mapping times of less than 1/20th of a second. An advantage of the present invention is to obtain high-resolution images for mappings where the data is acquired in a short period of time.

The mapping procedure of the present invention is as follows:

1) A 90° radio frequency pulse rotates the magnetization M from its equilibrium direction along the z-axis (i.e., the direction of the large applied static magnetic field) to the x-y plane;

2) The magnetization M at position (x,y) precesses at a frequency $\omega(x,y)$ about the local gradient fields at position (x,y);

3) The total magnetization is recorded by monitoring the induced voltage in receiver coils; and 4) The magnetization is Fourier transformed to give an effective mapping object density $\rho^*(x,y)$.

For long mapping times, the effective object density $\rho^*(x,y)$ is an accurate map of the actual spin density $\rho(x,y)$ using this standard procedure. However, for short mapping times, the effective object density $\rho^*(x,y)$ is not an accurate mapping of actual object density $\rho(x,y)$. The present invention therefore includes a further step:

5) A weighting function is obtained which combines in a specific manner an array of effective object density $\rho^*(x,y)$ values to define corrected object density $\rho^{**}(x,y)$ which more accurately represents the actual object density $\rho(x,y)$.

This additional step allows for high-resolution mapping of a moving subject, such as an organ like the heart. Furthermore, this additional step can also be used to obtain an increase in resolution or a decrease in mapping time.

Therefore, it is an object of the present invention to provide apparatus and method for magnetic resonance imaging which increases the accuracy of magnetic resonance images.

It is another object of the present invention to provide apparatus and method for magnetic resonance imaging which improves the spatial resolution of magnetic resonance images.

It is another object of the present invention to provide apparatus and method for magnetic resonance imaging which decreases the time required to obtain magnetic resonance images.

It is another object of the present invention to provide a means for reducing the stabilization time of the magnetic field gradients.

Further objects and advantages of the present invention will become apparent from a consideration of the drawings and the ensuing detailed description.

SUMMARY OF THE INVENTION

The present invention is directed to a method for producing increased-accuracy object density pixel values $\rho^{**}$ of an object from estimated object density pixel values $\rho^*$. Data values M extracted from the object are related to the integration of the actual object density $\rho$ over one-, two-, or three-dimensional space q with a weighting by a transform function F, i.e., $$M = \int F(q)\rho(q)dq, \quad (2.1)$$

and the estimated object density $\rho^*$ is related to the data values M by an approximate inverse transform, $\rho^*(q) = \Sigma E(q')M$. Therefore, the estimated object density $\rho^*$ is related to the actual object density $\rho$ by $$\rho^*(q) = \int \Sigma E(q')F(q)\rho(q')dq' = \int A(q,q')\rho(q')dq', \quad (2.2)$$

where $A(q,q') = \Sigma E(q')F(q)$ is the "kernel function." The kernel function A approximates, but is not equal to, a delta function $\delta(q-q')$, and therefore values of the actual object density $\rho(q')$ away from $q' = q$ contribute to $\rho^*(q)$. According to the present invention, the entries of a "kernel matrix" B are determined, where the (i,j)th entry of kernel matrix B is approximately equal to $\int A(q)dq$, with the integration being taken over a spatial grid element centered about position $(q_i - q_j)$. Therefore, the estimated object density $\rho^*$ is related to the actual object density $\rho$ by $$\rho^*(q_i) = \Sigma_j B_{ij}\rho(q_j). \quad (2.3)$$

A reverse matrix G is then calculated, where multiplication of the reverse matrix G with the kernel matrix B produces a product matrix H, where the (0,0) entry of the product matrix H is approximately unity and all other entries of the product matrix H are approximately zero. The increased-accuracy object density pixel values $\rho^{**}$ are then calculated by multiplication of the reverse matrix G with the estimated object density $\rho^*$, i.e., $$\rho^{**}(q_i)=\Sigma_j G_{ij}\rho^*(q_j), \quad (2.4)$$

whereby linear combinations of the estimated object density $\rho^*$ produce the increased-accuracy object density pixel values $\rho^{**}$.

The present invention is also directed to an apparatus for producing increased-accuracy object density pixel values $\rho^{**}$ of an object from estimated object density pixel values $\rho^*$. Data values M extracted from the object are related to the integration of the actual object density $\rho$ over one-, two-, or three-dimensional space q with a weighting by a transform function F, i.e., $$M=\int F(q)\rho(q)dq, \quad (2.5)$$

and the estimated object density $\rho^*$ is calculated according to the equation $\rho^*(q)=\Sigma E(q')M$. Therefore, the estimated object density $\rho^*$ is related to the actual object density $\rho$ by $$\rho^*(q)=\int \Sigma E(q')F(q)\rho(q')dq'=\int A(q,q')\rho(q')dq', \quad (2.6)$$

where $A(q,q')=\Sigma E(q')F(q)$ is the "kernel function." The kernel function A approximates, but is not equal to, a delta function $\delta(q-q')$, and therefore values of the actual object density $\rho(q')$ away from $q'=q$ contribute to $\rho^*(q)$. An integrator calculates the entries of a "kernel matrix" B, where the (i,j)th entry of the kernel matrix B is approximately equal to the integration of A(q) over a spatial grid element centered about position $(q_i-q_j)$. Therefore, the estimated object density $\rho^*$ is related to the actual object density $\rho$ by $$\rho^*(q_i)=\Sigma_j B_{ij}\rho(q_j). \quad (2.7)$$

A matrix equation solver determines reverse matrix G, where multiplication of the reverse matrix G with the kernel matrix B produces a product matrix H, the (0,0) entry of the product matrix H being approximately unity and all other entries of the product matrix H being approximately zero. A matrix multiplier then calculates the increased-accuracy object density pixel values $\rho^{**}$ by multiplying the reverse matrix G with the estimated object density $\rho^*$, i.e., $$\rho^{**}(q_i)=\Sigma_j G_{ij}\rho^*(q_j), \quad (2.8)$$

whereby linear combinations of the estimated object density $\rho^*$ produce the increased-accuracy object density pixel values $\rho^{**}$.

The present invention is also directed to a method for magnetic resonance imaging of an object having an object density $\rho$ to provide object density pixel values $\rho^*$ by measuring the magnetization M(t) during the application of a continuously-varying magnetic field gradients $q_x$ and $q_y$ along the x- and y-axes, respectively, so that the magnetization M(t) is related to the object density $\rho$ by $$M(t)=M_0 e^{(i\omega_0-1/T_2)t}\int \rho(x,y)e^{if_1\gamma x}e^{if_2\gamma y}dxdy,$$

where the functions $f_1(t)$ and $f_2(t)$ are given by $$f_1 = \int_0^t q_x(t')dt' \text{ and } f_2 = \int_0^t q_x(t')dt'.$$

The object density pixel values $\rho^*$ may therefore be obtained by $$\rho^*(x,y)=\Sigma e^{-(i\omega_0-1/T_2)t}e^{-if_1\gamma x}e^{-if_2\gamma y}M(t)W(t)\Delta t^2 \quad (4.3)$$

where the summation is taken at intervals of sample period $\Delta t$. The weighting function W(t) counteracts nonuniformities with which the functions $f_1(t)$ and $f_2(t)$ sample $f_1$-$f_2$ phase space, and said functions $f_1(t)$ and $f_2(t)$ essentially sample one and only one quadrant of the $f_1$-$f_2$ phase space.

The present invention is also directed to a method for magnetic resonance imaging of an object to provide object density pixel values $\rho^*$ from magnetization data values M extracted from the object over a data acquisition time $t_e$. The magnetization data values M are related to an integration of the actual object density $\rho$ over space q weighted by a transform function F, i.e., $M=\int F(q)\rho(q)dq$, and the estimated object density $\rho^*$ is related to the magnetization M by an approximate inverse transform, i.e., $\rho^*(q)=\Sigma E(q')M$, so that the estimated object density $\rho^*$ is related to the actual object density $\rho$ by $$\rho^*(q)=\int \Sigma E(q')F(q)\rho(q')dq=\int A(q,q')\rho(q')dq,$$

where $A(q,q')=\Sigma E(q')F(q)$ is a kernel function. The object has a spin-spin relaxation time $T_2(q)$ which varies with position and a characteristic spin-spin relaxation time $T_2^*$. The condition $$|1-\exp[t_e/T_2(x,y)-t_e/T_2^*]|<<1$$

is enforced so that the approximation can be made that the spin-spin relaxation time $T_2(q)$ can be set equal to the characteristic spin-spin relaxation time $T_2^*$.

BRIEF DESCRIPTION OF THE DRAWINGS

The accompanying drawings, which are incorporated in and form a part of the present specification, illustrate embodiments of the invention and, together with the Detailed Description of the Preferred Embodiments, serve to explain the principles of the invention.

DETAILED DESCRIPTION OF THE PREFERRED EMBODIMENTS

Figure 3:
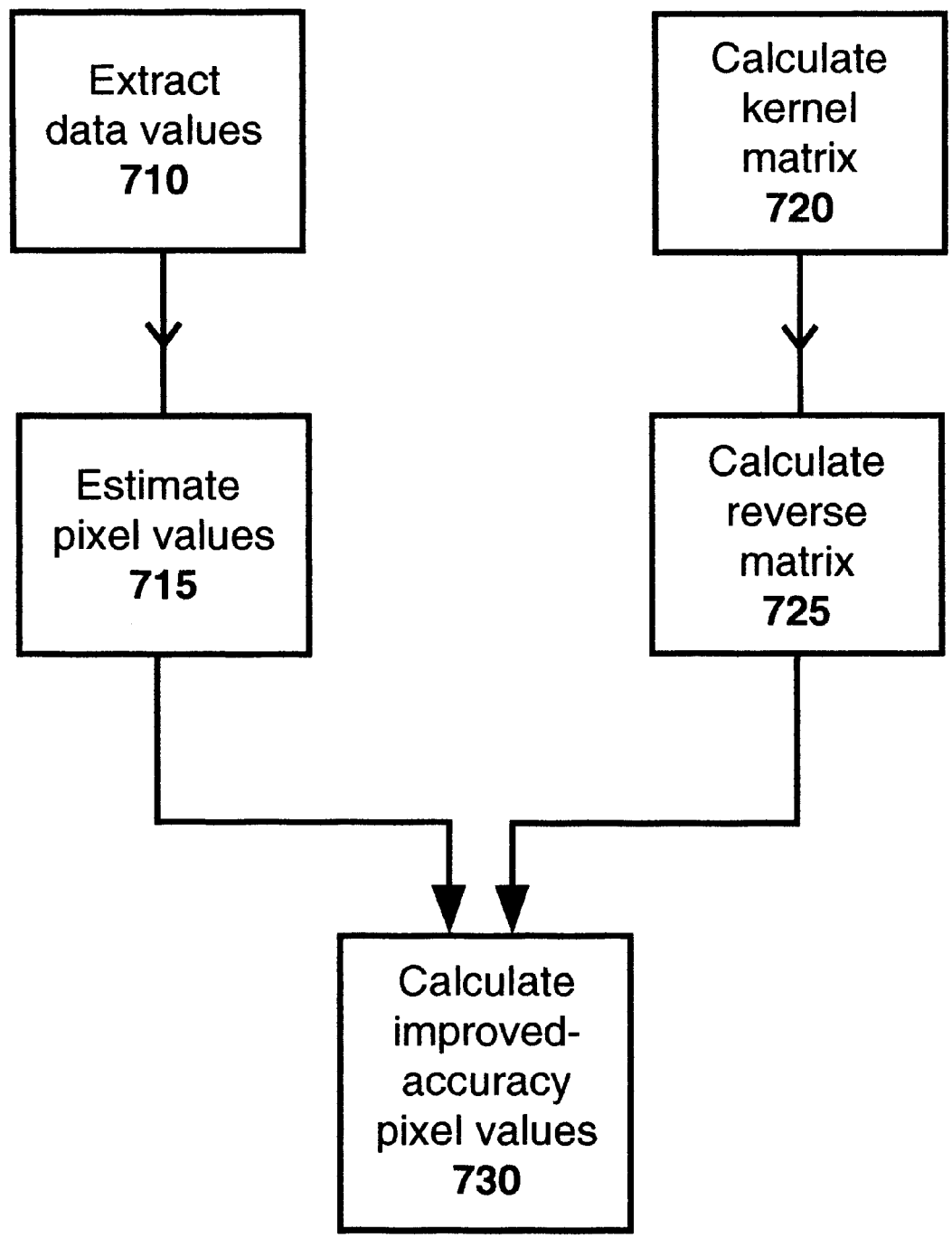
FIG. 3 is a flowchart depicting the method of the present invention.

As shown in the flowchart of FIG. 3, the method of the present invention begins with the extraction of data values 710 from the object under study. In the case of MRI imaging the data values are currents induced in solenoid coils, and from the induced currents the magnetization of the object can be inferred.

The general solution of the Bloch Equations for the magnetization in the x-y plane is obtained by combining equations (1.1.1) and (1.1.2) by multiplying equation (1.1.2) by the complex number i and adding it to equation (1.1.1) to provide $$dM/dt = i\gamma H_z M - M/T_2 \quad (3.1)$$

where $$M \equiv M_x + iM_y. \quad (3.2)$$

Once the magnetization in a selected plane has been rotated to the x-y plane, the magnetic field gradient along the z-axis is removed, and gradients $q_x \equiv \partial H_z/\partial x$ and $q_y \equiv \partial H_z/\partial y$ in the x- and y-directions, respectively, are applied, i.e., $$H_z(x,y) = H_0 + q_x x + q_y y. \quad (3.3)$$

As can be verified by direct substitution, the solution of equation (3.1) is $$M(t,x,y) = M_0 e^{(i\omega_0 - 1/T_2)t} e^{i\gamma q_x xt} e^{i\gamma q_y yt}. \quad (3.4)$$

If the x-gradient is applied for a period of time $t_1$, during which time there is no y-gradient, then $$M(t_1,x,y) = M_0 e^{(i\omega_0 - 1/T_2)t_1} e^{i\gamma q_x x t_1} \quad (3.5)$$

at the end of this period. If a gradient is then applied along the y-axis for time $t_1$ to $t \equiv t_1 + t_2$, during which time there is no x-gradient, the magnetization at time t is given by $$M(t,x,y) = M_0 e^{(i\omega_0 - 1/T_2)t} e^{i\gamma q_x x t_1} e^{i\gamma q_y y t_2}. \quad (3.6)$$

However, it is only the magnetization integrated over the activated region, i.e., $$M(t) = \int \rho(x,y) M(t,x,y) dx dy, \quad (3.7)$$

that can be directly measured, where $\rho(x,y)$ is the object density. Whereas the object density $\rho(x,y)$ may simply be the density of hydrogen nuclei in water and fat for a method consisting simply of a 90° pulse followed directly by data acquisition, in the case of the inversion recovery method the object density $\rho(x,y)$ is the magnetization subsequent to a 180° pulse, a waiting period on the order of $T_1$, and a 90° pulse, as discussed above.

If the expression for M(t) of equation (3.6), where the x-gradient in the magnetic field is applied from time 0 to time $t_1$ and the y-gradient in the magnetic field is applied from time $t_1$ to time $t \equiv t_1 + t_2$, is substituted into equation (3.7) the magnetization is given by $$M(t) = M_0 e^{(i\omega_0 - 1/T_2)t} \int \rho(x,y) e^{i\gamma q_x x t_1} e^{i\gamma q_y y t_2} dx dy, \quad (3.8)$$

where the assumption has been made that $T_2$ is independent of position so the factor $\exp[(i\omega_0 - 1/T_2)t]$ may be taken outside the integral. If $t_1$ and $t_2$ are defined as $t_1 = n_1 \Delta t$ and $t_2 = n_2 \Delta t$, where $\Delta t$ is the "dwell time" and $n_1$ and $n_2$ are integers, then equation (3.8) becomes $$M(n_1,n_2) = M_0 e^{(i\omega_0 - 1/T_2)(n_1 + n_2)\Delta t} \int \rho(x,y) e^{i\gamma q_x x n_1 \Delta t} e^{i\gamma q_y y n_2 \Delta t} dx dy. \quad (3.9)$$

If the data acquisition 710 is implemented by recording the magnetization $M(n_1,n_2)$ for $n_1 = 0,1,2, \ldots, N_x$ and $n_2 = 0,1,2, \ldots, N_y$ (i.e., there are $W \equiv \times N_y$ recording times), then estimation 715 of the object density pixel value $\rho$ at coordinates $(x^*,y^*)$ is given by $$\rho^*(x,y) = \text{Real}\left\{\sum_{n_1=0}^{N_x} \sum_{n_2=0}^{N_y} e^{-(i\omega_0 - 1/T_2)(n_1 + n_2)\Delta t} e^{-i\gamma q_x x n_1 \Delta t} e^{-i\gamma q_y y n_2 \Delta t} M(n_1,n_2)\right\} \quad (3.10)$$

due to the approximate orthogonality of the exponential functions when integrated over a finite range.

The approximate nature of $\rho^*(x,y)$ of equation (3.10) for the object density value $\rho(x,y)$ of this stage 715 of the method of the present invention is clarified by substitution of equation (3.9) into equation (3.10) to provide $$\rho^*(x,y) = M_0 \int \rho(x^*,y^*) \text{ Real }\{A(x-x^*, y-y^*)\} dx^* dy^* \quad (3.11)$$

where $$A \equiv A(x - x^*, y - y^*) \quad (3.12)$$

$$= \left(\sum_{n_1=0}^{N_x} e^{i\gamma q_x n_1 \Delta t(x-x^*)}\right)\left(\sum_{n_2=0}^{N_y} e^{i\gamma q_y n_2 \Delta t(y-y^*)}\right).$$

Expansion of the sums of equation (3.12) and use of trigonometric identities provides $$\text{Real }\{A\} = A^{(1)}(\alpha_x, N_x) A^{(1)}(\alpha_y, N_y) - A^{(2)}(\alpha_x, N_x) A^{(2)}(\alpha_y, N_y) \quad (3.13)$$

where $$A^{(1)}(\alpha, N) \equiv \quad (3.14.1)$$

$$\frac{(1 - \cos(\alpha(N+1))) \cdot (1 - \cos\alpha) + \sin(\alpha(N+1)) \cdot \sin\alpha}{(1 - \cos\alpha)^2 + \sin^2\alpha}$$

$$A^{(2)}(\alpha, N) \equiv \quad (3.14.2)$$

$$\frac{(1 - \cos(\alpha(N+1))) \cdot \sin\alpha - \sin(\alpha(N+1)) \cdot (1 - \cos\alpha)}{(1 - \cos\alpha)^2 + \sin^2\alpha}$$

where $$\alpha_x = \gamma q_x \Delta t(x-x^*) \text{ and } \alpha_y = \gamma q_y \Delta t(y-y^*). \quad (3.14.3)$$

From equation (3.11) it can be seen that Real{A} would ideally be proportionate to the product of two delta functions, i.e., $\delta(x-x^*)\delta(y-y^*)$, so that the estimate of the object density $\rho^*(x,y)$ is equal to the actual object density $\rho(x,y)$. This is confirmed by a Taylor series expansion of $A^{(1)}$ in $\alpha$ about $\alpha=0$ which provides $$A^{(1)} \sim (N+1) - \alpha^2[(N+1)^3/6 - (N+1)^2/4 + (N+1)/12] + \ldots, \quad (3.15)$$

showing that the magnitude of the central peak increases linearly with N, and the width of the peak goes as 1/N for large N. And, a Taylor series expansion of $A^{(2)}$ in $\alpha$ about $\alpha=0$ provides $$A^{(2)} \sim \alpha[(N+1)^2/2 - (N+1)], \quad (3.16)$$

indicating that $A^{(2)}$ does not substantially contribute to the height or width of the central peak. Furthermore, it may be noted that since $A^{(1)}$ is an even function of $\alpha$, Real{A} is an even function of $(x-x^*)$ and $(y-y^*)$ near the central peak.

Figure 1A:
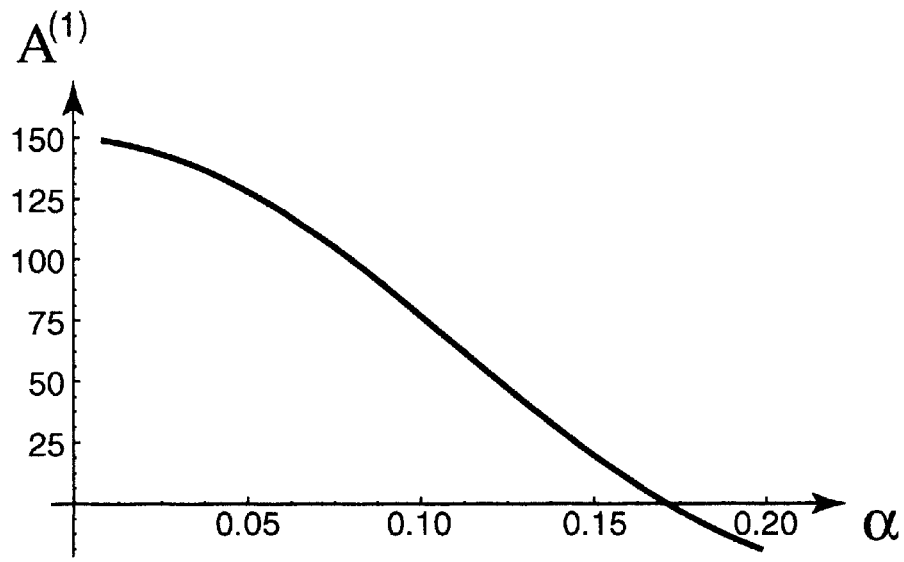
FIGS. 1A and 1B plot the function $A^{(1)}$ for the number of sample values N equal to 150, and FIGS. 1C and 1D plot the function $A^{(1)}$ for the number of sample values N equal to 450.
Figure 1B:
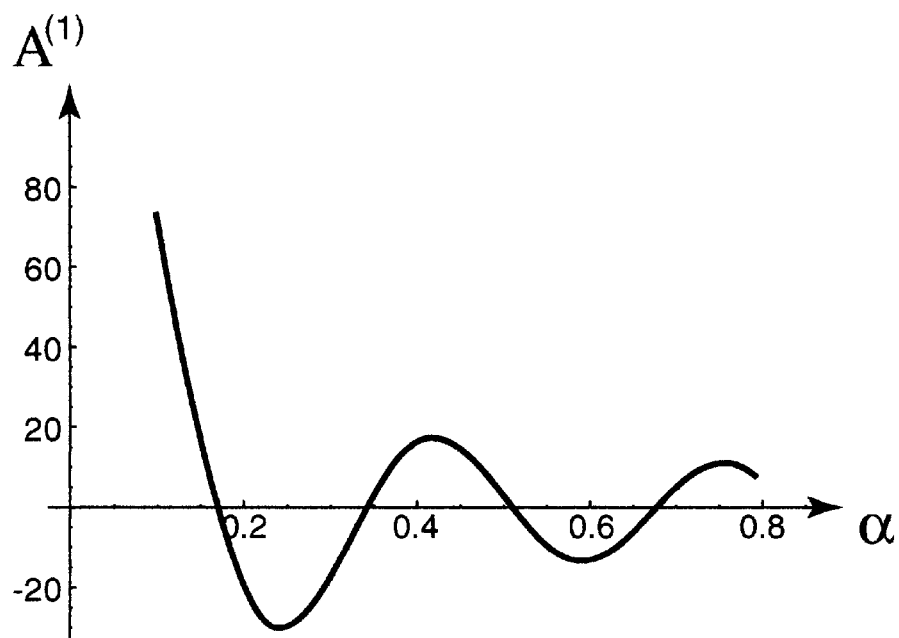
Figure 1C:
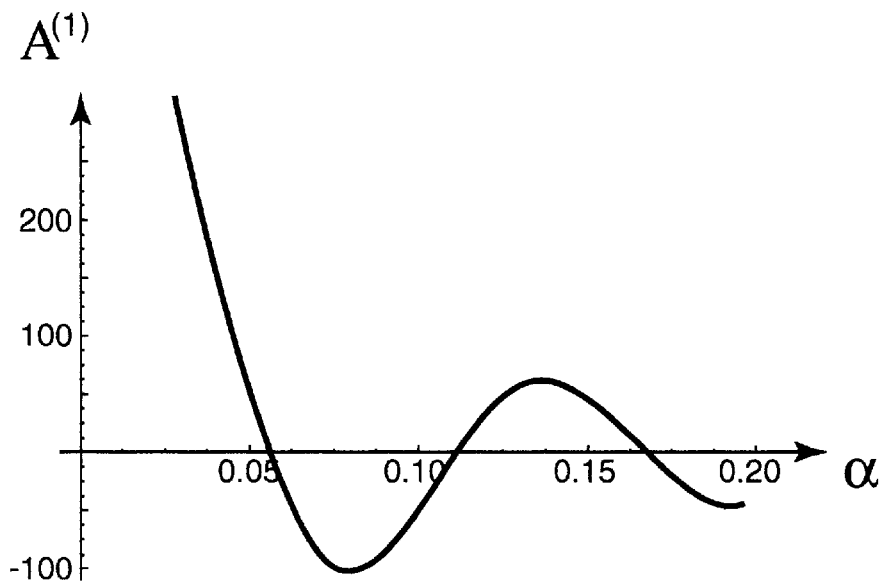
Figure 1D:
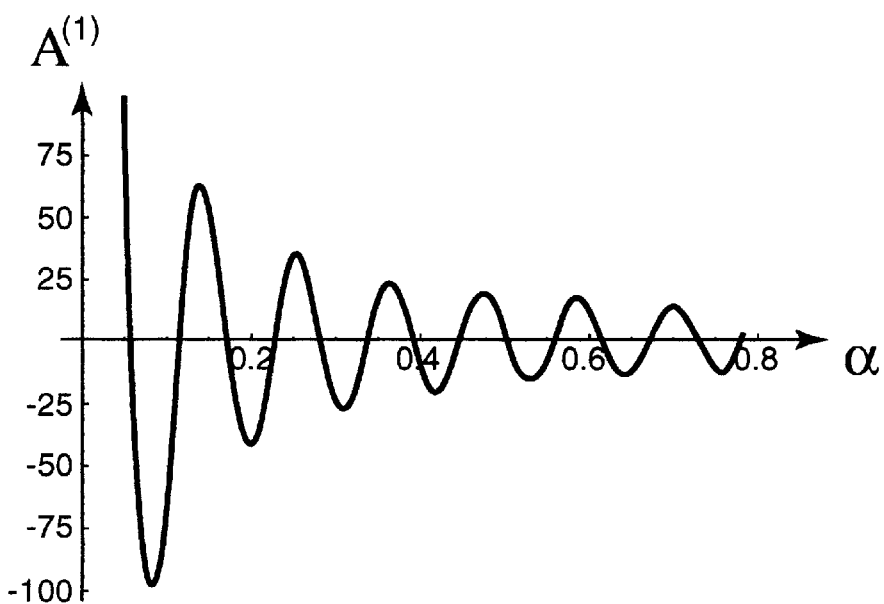

The behavior for $A^{(1)}$ is illustrated graphically by FIGS. 1A through 1D. FIGS. 1A and 1B plot $A^{(1)}$ for N=150 and $\gamma q \Delta t=0.123$ over the ranges $0 \leq \alpha \leq 0.2$ and $0 \leq \alpha \leq 0.8$, respectively, and it can be seen that the function $A^{(1)}$ has a central peak with a magnitude of approximately 150 and a halfwidth of about 0.1, and the next largest extremum (located at $\alpha \approx 0.21$) has a magnitude of approximately 35. FIGS. 1C and 1D plot $A^{(1)}$ over the ranges $0 \leq \alpha \leq 0.2$ and $0 \leq \alpha \leq 0.8$, respectively, for the same value of $\gamma q \Delta t$ as plotted in FIGS. 1A and 1B, but with N increased to 450. Comparison of the plots of FIGS. 1C and 1D with the plots of FIGS. 1A and 1B shows that the increase in the value of N causes the central peak of the function $A^{(1)}$ to become substantially larger and narrower, and the other extrema to become smaller in relation to the central peak, so $A^{(1)}$ better approximates a delta function. In particular, in the plot of FIGS. 1C and 1D the central peak of the function $A^{(1)}$ has a magnitude of approximately 450 and a halfwidth of about 0.03, and the next largest extremum has a magnitude of approximately 100.

Figure 2A:
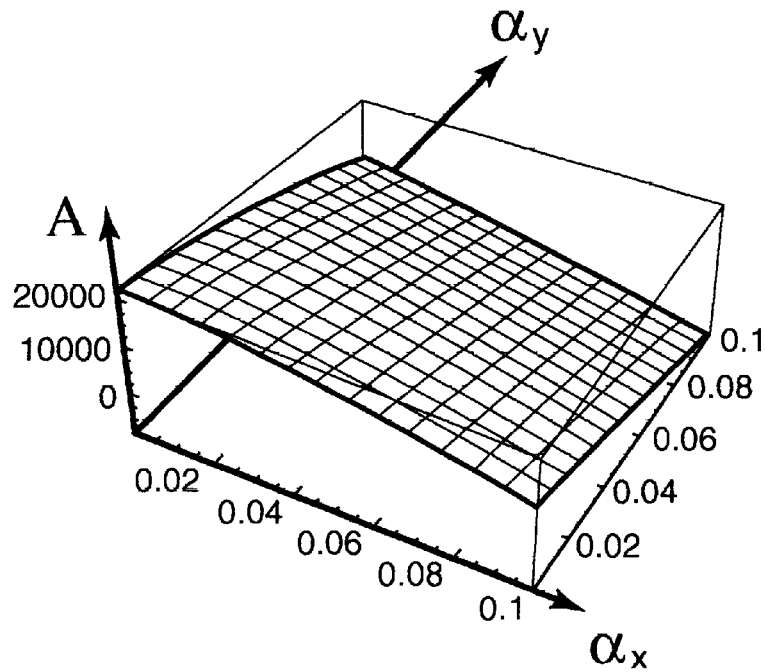
FIGS. 2A and 2B plot the kernel function $A(\alpha_x,\alpha_y)$ for the number of sample values N equal to 150, and FIGS. 2C and 2D plot the function $A(\alpha_x,\alpha_y)$ for the number of sample values N equal to 450.
Figure 2B:
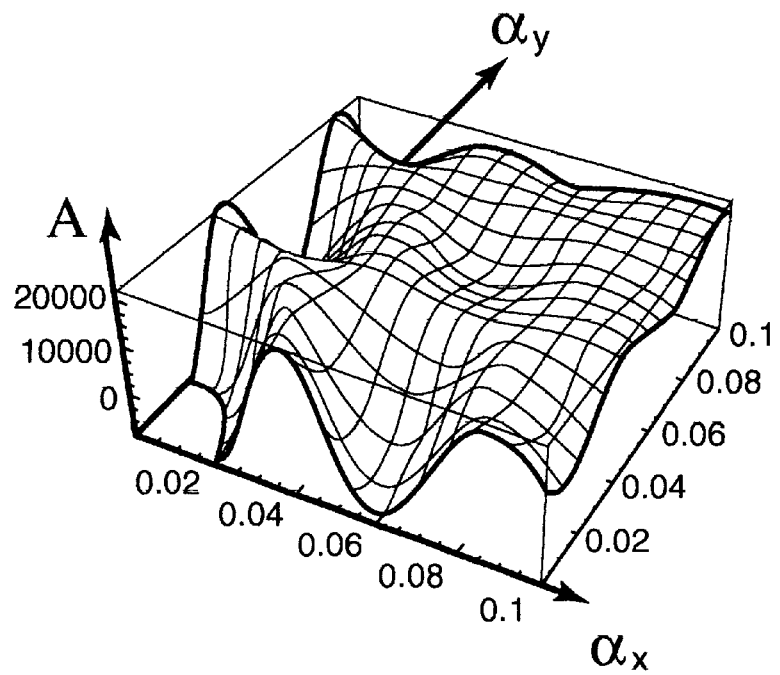
Figure 2C:
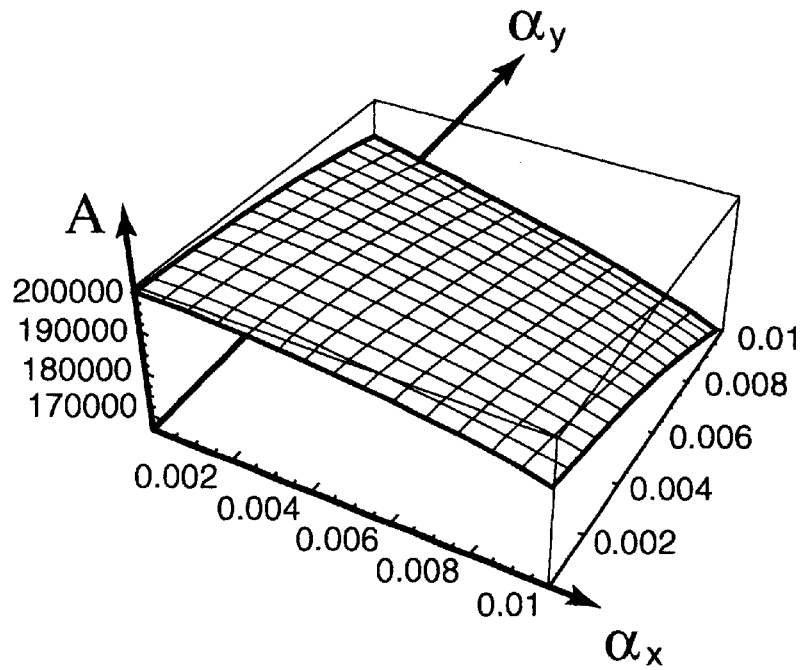
Figure 2D:
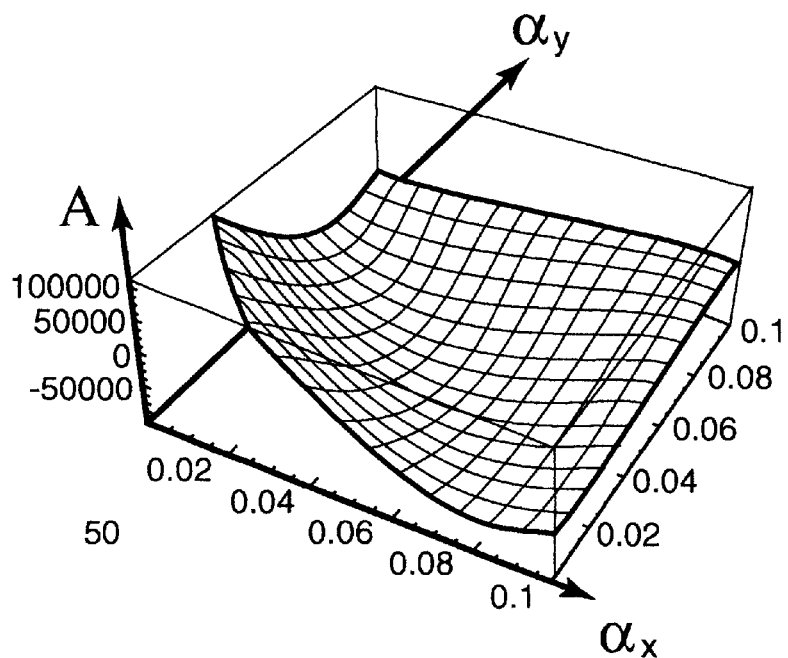

Three-dimensional plots of $A(\alpha_x, \alpha_y)$ shown in FIGS. 2A through 2D, with $q_x$ taken as equal to $q_y$, i.e., $q_x=q_y\equiv q$, and $N_x$ taken as equal to $N_y$, i.e., $N_x=N_y\equiv N$, further confirm that $A(\alpha_x, \alpha_y)$ becomes an increasingly effective approximation of the product of delta functions $\delta(\alpha_x)$ and $\delta(\alpha_x)$ as N becomes large. As shown by FIGS. 2A and 2B which plot $A(\alpha_x, \alpha_y)$ for N=150 and $\gamma q_x \Delta t=0.123$ over the ranges $0 \leq \alpha_x$, $\alpha_y \leq 0.1$ and $0 \leq \alpha_x$, $\alpha_y \leq 0.8$, respectively, the central peak has a magnitude of approximately 20,000 and a halfwidth of approximately 0.05, and the oscillations in magnitude decay to values which are a tenth as large by $\alpha_x=\alpha_y=0.5$. As shown by FIGS. 2C and 2D which plot A over the ranges $0 \leq \alpha_x$, $\alpha_y \leq 0.01$ and $0 \leq \alpha_x$, $\alpha_y \leq 0.1$, respectively, when N is increased by a factor of three to N=450 for the same value of $\gamma q_x \Delta t$, the central peak has a magnitude of approximately 202,000, and a halfwidth of approximately 0.02 which is approximately one third as wide.

Alternatively, the magnetic field gradients may be varied continuously with time, as is described in U.S. Pat. No. 4,642,567 by Jerome I. Kaplan, issued Feb. 10, 1987, Ser. No. 617,163, which is incorporated herein by reference. An advantage of varying the field gradients continuously is that noise generated by switching between discrete field gradient levels is avoided. In particular, if the magnetic field gradient along the x-axis, $q_x$, and the magnetic field gradient along the y-axis, $q_y$, are continuous functions of time t, then equation (3.8) may be generalized as $$M(t)=M_0 e^{(i\omega_0-1/T_2)t} \int \rho(x,y) e^{if_1\gamma x} e^{if_2\gamma y} dxdy, \quad (4.1)$$

where $$f_1 = \int_0^t q_x(t')dt' \text{ and } f_2 = \int_0^t q_x(t')dt'. \quad (4.2)$$

(And conversely, equation (3.8) simplifies to equation (4.1) when the magnetic field along the x-axis has a constant value for a time $t_1$ and is zero otherwise, and the magnetic field along the y-axis has a constant value for a time $t_2$ and is zero otherwise.)

If $f_1$ and $f_2$ are parameterized as a function of time t, then the inversion of equation (4.1) is given by $$\rho^*(x,y)=\Sigma e^{-(i\omega_0-1/T_2)t} e^{-if_1\gamma x} e^{-if_2\gamma y} M(t) W(t) \Delta t^2 \quad (4.3)$$

where the summation is over samples of the summand separated by sample period $\Delta t$, and the weighting function W(t) is included to counteract any nonuniformity with which the functions $f_1(t)$ and $f_2(t)$ sample the $f_1$-$f_2$ phase space. As discussed above, the kernel function is defined by equation (3.11).

Figure 5:
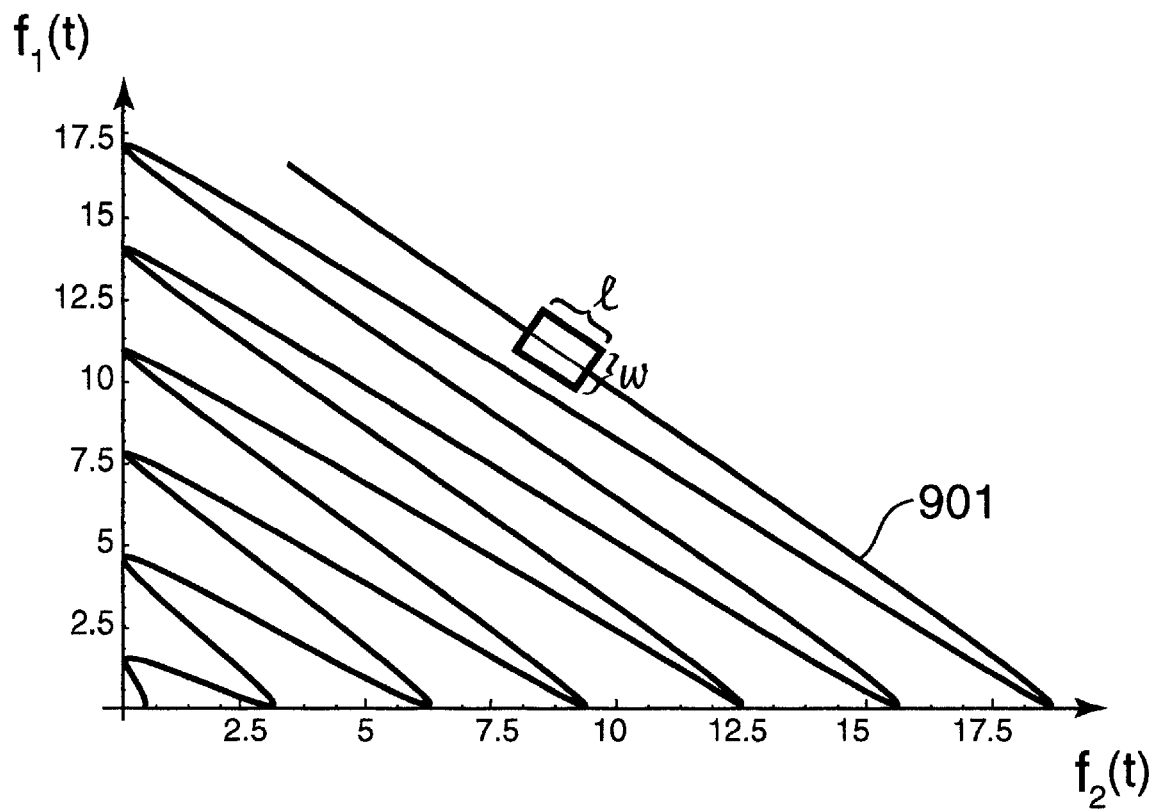
FIG. 5 shows a preferred parameterization of the applied field gradients.

According to the present invention, preferred parameterizations effectively fill one and only one quadrant of the $f_1$-$f_2$ phase space. For instance, a preferred parameterization according to this criterion is the parameterization $$f_1(t)=ct\cos^2 t \text{ and } f_2(t)=ct\sin^2 t, \quad (4.4)$$

which is graphed in FIG. 5. A weighting function W(t) of this parameterization can then be estimated to be the product of the length l traversed by the path 901 during sample period $\Delta t$ and the distance w between segments of the path 901. In particular, $$l=[(\partial f_1/\partial t)^2+(\partial f_2/\partial t)^2]\approx c\sqrt{2}t|\sin 2t|, \quad (4.5)$$

and taking the distance between segments of the path along a line at 45° from the $f_1(t)$ and $f_2(t)$ axes, i.e., the distance between points $t=[2n+1]\pi/4$ and $t=[2(n+1)+1]\pi/4$, $$w=c\sqrt{2}\,\pi/2\cos^2 \pi/4. \quad (4.6)$$

Therefore, in this case $$W(t)=\pi c^2 t |\sin 2t| \cos^2(\pi/4). \quad (4.7)$$

As noted above, the assumption that $T_2$ is independent of position was made when the factor $\exp[(i\omega_0-1/T_2)t]$ was taken outside the integral in equation (3.8). However, as discussed above, $T_2$ varies as a function of the material or between normal and ischemic regions so, for example, the $T_2$ relaxation time differs between the myocardium and the internal blood-filled cavity. Therefore, if the position dependence of $T_2$ is not neglected the expression for $M(n_1,n_2)$ is actually $$M(n_1,n_2)=M_0 \int \rho(x,y) e^{(i\omega_0-1/T_2(x,y))(n_1+n_2)\Delta t} e^{i\gamma q_x x n_1 \Delta t} e^{i\gamma q_y y n_2 \Delta t} dxdy, \quad (5.1)$$

then the density is approximated by $$\varrho^*(x^*, y^*) = \text{Real}\left\{\sum_{n_1=0}^{N_1}\sum_{n_2=0}^{N_2} e^{-(i\omega_0-1/T_2^*)(n_1+n_2)\Delta t} \times \right. \quad (5.2)$$

$$\left. e^{-i\gamma q_x x^* n_1 \Delta t} e^{-i\gamma q_y y^* n_2 \Delta t} M(n_1,n_2)\right\},$$

where $T_2^*$ is a characteristic relaxation time, such as the mean value of $T_2(x,y)$ over the range of integration. The proper expression for the kernel A is then $$A = \left(\sum_{n_1=0}^{N_x} e^{i\gamma q_x n_1 \Delta t(x-x^*)} e^{n_1 \Delta t[1/T_2^*-1/T_2(x,y)]}\right) \times \quad (5.3)$$

$$\left(\sum_{n_2=0}^{N_y} e^{i\gamma q_y n_2 \Delta t(y-y^*)} e^{n_2 \Delta t[1/T_2^*-1/T_2(x,y)]}\right).$$

Defining $$\tau \equiv [\Delta t/T_2^* - \Delta t/T_2(x,y)] \quad (5.4)$$

and applying trigonometric identities to equation (5.3), the kernel A can be written as $$A = A^{(1)}(\alpha_x,\tau)A^{(1)}(\alpha_y,\tau) - A^{(2)}(\alpha_x,\tau)A^{(2)}(\alpha_y,\tau) \quad (5.5)$$

where $$A^{(1)}(\alpha,\tau) \equiv \frac{(1-e^{-(N+1)\tau}\cos(\alpha(N+1))\cdot(1-e^{-\tau}\cos\alpha) + e^{-(N+1)\tau}\sin(\alpha(N+1))\cdot\sin\alpha}{(1-e^{-\tau}\cos\alpha)^2 + e^{-2\tau}\sin^2\alpha} \quad (5.6.1)$$

and $$A^{(2)}(\alpha,\tau) \equiv \frac{(1-e^{-(N+1)\tau}\cos(\alpha(N+1))\cdot e^{-\tau}\sin\alpha - e^{-(N+1)\tau}\sin(\alpha(N+1))\cdot(1-e^{-\tau}\cos\alpha)}{(1-e^{-\tau}\cos\alpha)^2 + e^{-2\tau}\sin^2\alpha}. \quad (5.6.2)$$

According to a preferred embodiment of the present invention, the dwell time $\Delta t$ is chosen to be short relative to the relaxation time $T_2$ and N is chosen to be small enough that the factors of $e^{-\tau}$ and $e^{-(N+1)\tau}$ can be taken as equal to unity, i.e., $$|1-e^{-\tau}| \ll 1 \quad (5.7.1)$$

and $$|1-e^{-(N+1)\tau}| \ll 1, \quad (5.7.2)$$

and so the $\tau$ dependence can be neglected. Preferably, $|1-e^{-(N+1)\tau}|$ is less than 0.1, more preferably less than 0.03, even more preferably less than 0.001, even more preferably less than 0.0003, still more preferably less than 0.0001, and even still more preferably less than 0.00003. For instance, $T_2$ is typically $\frac{1}{10}$th of a second. If $T_2^*$ is taken as 0.1 seconds and $T_2(x,y)$ varies by 10% (e.g., $T_2(x,y)$ has a value 0.11 seconds), then for a dwell time of $2\times10^{-6}$ seconds, $\tau = 1.8 \times 10^{-6}$ and $e^{-\tau} \approx 0.9999982$. Even for N as large as 160, $e^{-(N+1)\tau} \approx 0.99971$, and so is clearly still close enough to a value of unity to be taken as such. Therefore, plots of $A^{(1)}(\alpha,\tau)$ for $N \approx 160$, $T_2^* = 0.1$ seconds and $T_2(x,y) = T_2^* \pm 10\%$, are not visibly discernable from the plots of $A^{(1)}(\alpha,0)$ of FIGS. 1A–D.

The heart is a particularly difficult organ to image with MRI because it is constantly in motion. For instance, data acquisition for imaging of the human heart must be performed within $\frac{1}{20}$th of a second. It is therefore required that the total number of samples $N^2$ multiplied by the dwell time $\Delta t$ is less than or equal to 0.05 seconds. For instance, for an apparatus with a dwell time $\Delta t$ of two microseconds, N must be less than or equal to 158 if the condition $|1-e^{-(N+1)\tau}| \ll 1$ is to be satisfied. However, other organs or parts of the anatomy do not move as rapidly and so the value of N, and therefore the spatial resolution, does become limited by the condition $|1-e^{-(N+1)\tau}| \ll 1$.

As can be seen from the plots of FIGS. 1A–1D and FIGS. 2A–2D, for finite N the value of the calculated object density $\rho^*$ at (x,y) determined via equation (3.11) is dependent not only on the value of the actual object density $\rho$ in the neighborhood of (x,y) due to the contribution of the central peak of A, but also on the actual object density $\rho$ in regions away from (x,y) due to contributions from other extrema of the kernel A. According to the present invention compensation is provided to counter the contributions to the calculated object density $\rho^*$ from nonzero regions outside the central peak of the kernel A to produce an increase in accuracy. According to the present invention, this is accomplished by approximating the integral of equation (3.11) with the summation $$\varrho^*(x_i, y_j) = \sum_{k,l} B_{i-k, j-l} \varrho(x_k, y_l) \quad (6.1)$$

where the sample plane is divided into a P×P grid of dimensions $\Delta x \times \Delta y$, and the kernel matrix $B_{ij}$ is calculated 720 according to the method of the present invention depicted in FIG. 3 as $$B_{ij} = \int A(x,y)dxdy, \quad (6.2)$$

with the integral taken over a $\Delta x \times \Delta y$ grid square centered about coordinates (i×$\Delta x$, j×$\Delta y$). The integrations may be performed using an integration routine, such as the programs provided in chapter 4 of Numerical Recipes, by William H. Press, Brian P. Flannery, Saul A. Teukolsky and William T. Vetterling, Cambridge University Press, Cambridge, 1986, which is incorporated herein by reference.

According to the present invention depicted in FIG. 3, an increased-accuracy object density $\rho^{**}(x,y)$ is then obtained 730 by linear combinations of the calculated object density $\rho^*(x)$ according to $$\varrho^{**}(x_i, y_j) = \sum_{k,l} G_{i-k, j-l} \varrho^*(x_k, y_l) \quad (6.3)$$

where the "reverse matrix" G is obtained 725 such that the correct linear combinations of $\rho^*$ more closely approximate the actual object density pixel values $\rho$. Substituting equation (6.1) into equation (6.3) provides $$\varrho^{**}(x_i, y_j) = \sum_{k,l,p,q} G_{i-k,j-l} B_{k-p,l-q} \varrho(x_p, y_q), \text{ or} \quad (6.4)$$

$$\varrho^{**}(x_i, y_j) = \sum_{k,l} H_{i-k, j-l} \varrho(x_k, y_l) \quad (6.5)$$

where $$H_{i-k, j-l} = \sum_{p,q} G_{i-p, j-q} B_{p-k, q-l}. \quad (6.6)$$

Thus, the correct linear combinations of the calculated object density $\rho^*(x)$ will provide the actual object density $\rho(x)$ if a reverse matrix G is found such that $$H_{0,0} = 1$$

$$H_{i,j} = 0 \text{ for } i \neq 0, j \neq 0 \quad (6.7)$$

The matrix G may be determined using a matrix solution routine, such as the programs of chapter 2 of Numerical Recipes, which is incorporated herein by reference. An increased-accuracy object density $\rho^{**}(x,y)$ is then calculated from equation (6.3) via a matrix multiplication.

It should be understood that although it is assumed in the above exposition that the sample is a two-dimensional section of the object under investigation, and therefore the matrices A, G and H have two subscripts, in general the sample may be n-dimensional and A, G and H become tensors having n subscripts. In particular, if the sample is an n-dimensional slice of the object, where n is equal to 1, 2 or 3, then equation (3.7) is generalized to $$M = \int \rho(x1, x2, \ldots, xn)M(x1, x2, \ldots, xn)dx1\, dx2\, \ldots\, dxn, \quad (7.1.1)$$

or $$M = \int \rho(q)M(q)dq, \quad (7.1.2)$$

or $$M = \int \rho(q)F(q)dq, \quad (7.1.3)$$

where q represents the n-dimensional spatial variable and F(q) is a function of the applied magnetic field gradients. An estimated object density $\rho^*$ is related to said data values M by an approximate inverse transform, i.e., $$\rho^*(q) = \Sigma E(q')M, \quad (7.2)$$

so that the estimated object density $\rho^*$ is related to the actual object density $\rho$ by $$\rho^*(q) = \int \Sigma E(q')F(q)\rho(q')dq' = \int A(q,q')\rho(q')dq', \quad (7.3)$$

where $A(q,q') = \Sigma E(q')F(q)$ is a kernel function which approximates the delta function $\delta(q-q')$. According to the present invention an n-dimensional kernel tensor B is defined whose $(i1, i2, \ldots, in)^{th}$ entry is given by $$B_{i1, i2, \ldots, in} = \int A(x1, x2, \ldots xn)dx1\, dx2 \ldots dxn,$$

where the integration is taken over an n-dimensional spatial grid element, and the estimated object density $\rho^*$ is related to the actual object density $\rho$ by the approximation $$\rho^*(x1_i, x2_j, x3_k, \ldots) = \Sigma_{l,m,n} B_{i-l, j-m, k-n, \ldots} \rho(x1_l, x2_m, x3_n, \ldots).$$

An n-dimensional reverse tensor G is determined such that multiplication of the reverse tensor G with the kernel tensor B produces a product tensor H which has entries of approximately zero except for an entry of approximately unity at the $(0, 0, \ldots, 0)$ position, and increased-accuracy object density pixel values $\rho^{}$ are determined by $$\rho^{}(x1_i, x2_j, x3_k, \ldots) = \Sigma_{l,m,n} G_{i-l, j-m, k-n, \ldots} \rho^*(x1_l, x2_m, x3_n, \ldots).$$

For example, for a one-dimensional section, where it is assumed that the kernel matrix B has only three nonzero values per row and is approximately symmetric near its central peak, i.e., $B_1 = B_{-1}$, equation (6.1) becomes $$\rho^*_i = B_0 \rho_i + B_1[\rho_{i+1} + \rho_{i-1}], \quad (8.1)$$

where the notation $\rho_i \equiv \rho(x_i)$ is used. Similarly, equation (6.3) becomes $$\rho^{**}_i = G_0 \rho^*_i + G_1(\rho^*_{i+1} + \rho^*_{i-1}) + G_2(\rho^*_{i+2} + \rho^*_{i-2}). \quad (8.2)$$

Substituting properly subscripted versions of equation (8.1) into equation (8.2) then provides $$\begin{aligned}\varrho^{**}_i = &\, G_0[B_0 \varrho_i + B_1(\varrho_{i+1} + \varrho_{i-1})] + \\ & G_1[B_0 \varrho_{i+1} + B_1(\varrho_{i+2} + \varrho_i) + B_0 \varrho_{i-1} + \\ & B_1(\varrho_i + \varrho_{i-2})] + G_2[B_0 \varrho_{i+2} + B_1(\varrho_{i+3} + \varrho_{i+1})) + \\ & B_0 \varrho_{i-2} + B_1(\varrho_{i-1} + \varrho_{i-3})]\end{aligned} \quad (8.3)$$

or $$\begin{aligned}\varrho^{**}_i = &\, \varrho_i[G_0 B_0 + G_1 B_1 + G_1 B_1] + \\ & \varrho_{i+1}[G_0 B_1 + G_1 B_0 + G_2 B_1] + \varrho_{i-1}[G_0 B_1 + G_1 B_0 + \\ & G_2 B_1] + \varrho_{i+2}[G_1 B_1 + G_2 B_0] + \varrho_{i-2}[G_1 B_1 + G_2 B_0] + \\ & \varrho_{i+3}[G_2 B_1] + \varrho_{i-3}[G_2 B_1]\end{aligned} \quad (8.4)$$

Equating the first three coefficients of $\rho$ from equation (8.3) with the first three coefficients of $\rho$ from the one-dimensional analog of equation (6.5), i.e., $$\rho^{**}_i = H_0 \rho_i + H_1(\rho_{i+1} + \rho_{i-1}) + H_2(\rho_{i+2} + \rho_{i-2}) + H_3(\rho_{i+3} + \rho_{i-3}) + \ldots \quad (8.5)$$

provides $$1 = G_0 B_0 + 2G_1 B_1$$
$$0 = G_0 B_1 + G_1 B_0 + G_2 B_1$$
$$0 = G_1 B_1 + G_2 B_0 \quad (8.6)$$

which can be solved to determine $G_0$, $G_1$ and $G_2$ so that an increased accuracy computation of can be provided by equation (8.2). It should be noted that although the coefficients $G_3$, $G_4$, $\ldots$ in equation (8.2) will generally not be strictly zero, and therefore there will be nonzero contributions to the increased-accuracy object density $\rho^{**}$ from $\rho^*_{i+3}$, $\rho^*_{i-3}$, $\rho^*_{i+4}$, $\rho^*_{i-4}$, $\ldots$ terms, such terms contribute relatively little to $\rho^{**}$.

Figure 4:
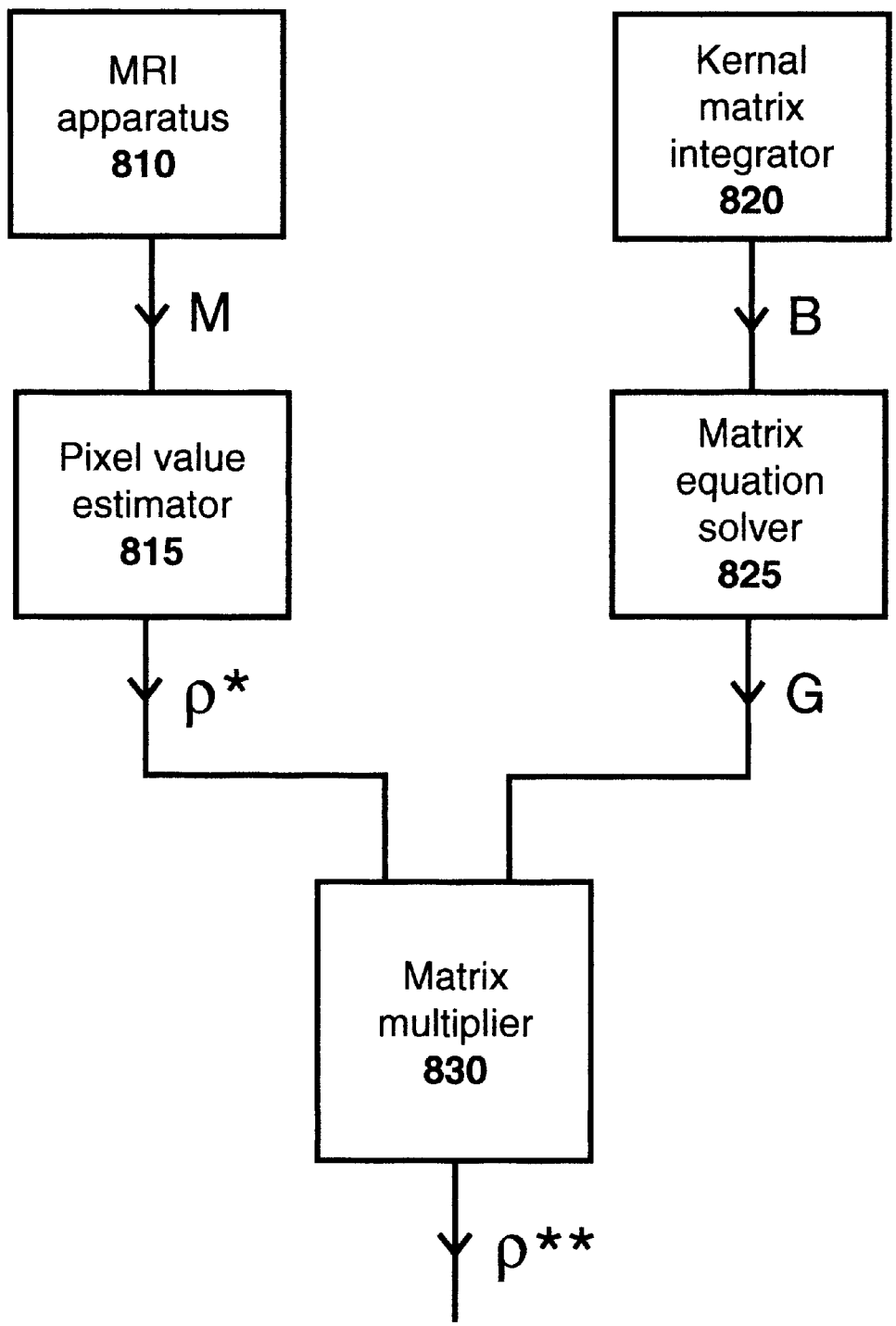
FIG. 4 is a flowchart depicting the apparatus of the present invention.

Although the present invention has been described in terms of the method of FIG. 3, the invention may also be consider to be an apparatus which produces increased-accuracy object density pixel values $\rho^{**}$, as is shown in FIG. 4. In particular, a magnetic resonance imaging apparatus 810 produces magnetization data values M as described in reference to equation (3.8), and these magnetization data values M are used by a pixel value estimator 815 to provide object density pixel values $\rho^*$ according to equation (3.10). According to the apparatus of the present invention, a kernel matrix integrator 820 is used produce a kernel matrix B according to equation (6.2) and this kernel matrix B is used by a matrix equation solver 825 to produce reverse matrix G, such that the multiplication of G and B produces a matrix H which has a $(0,0, \ldots)$ entry of approximately unity and all other entries are approximately zero. Then, a matrix multiplier 830 is used to generate increased-accuracy object density pixel values $\rho^{**}$ according to equation (6.3).

Method and apparatus for rapid, high-accuracy magnetic resonance imaging have therefore been described in the present specification. Although the above description contains many specificities, these should not be construed as limiting the scope of the invention, but as merely providing illustrations of some of the preferred embodiments of this invention. Many variations are possible and are to be considered within the scope of the present invention. For instance, although the present invention has been described in terms of magnetic resonance imaging using the inversion recovery technique over two-dimensional samples, it should be understood that the present invention can be applied to any imaging method where a measured variable M is related to an actual object density $\rho$ by an integration over space q using a transform function F, i.e., $M(t) = \int F(t, q)\rho(q)dq$.

It should also be noted that to take advantage of symmetries in the kernel, the exposition above uses a matrix notation where the subscripts denote coordinates in orthogonal directions. More generally, the grid elements may be enumerated by a single set of integers and each subscript of a matrix may denote a particular grid element. Using this notation, the (i,j) element of a matrix B is set equal to $\int A(q)dq$ over a spatial grid element centered about position $(q_i - q_j)$ where $q_i$ is the position vector of the $i^{th}$ grid element, and the relationship between the estimated object density $\rho^*$ and the actual object density $\rho$ is approximated by a matrix equation $\rho^*(q_i) = \Sigma_j B_{ij} \rho(q_j)$. A matrix G is then determined such that $\Sigma_k G_{ik} B_{kj} = H_{ij}$, where $H_{0,0} = 1$ and all other entries of H are zero, and an improved accuracy object density $\rho^*$ is obtained from linear combinations of the estimated object density according to the relation $$\rho^{**}(q_i) = \Sigma_j G_{ij} \rho^*(q_j).$$

Furthermore, it should be noted that while some aspects of the present invention are described in terms of the imaging of the heart for convenience, and particularly to emphasize the usefulness of the present invention for rapid imaging, the present invention may be applied to the imaging of any organs or biological tissues, or any materials with variations in material density and/or relaxation times. Other variations which are possible and are to be considered within the scope of the present invention include: an imaging technique other than magnetic resonance imaging may be used; an imaging technique other than the inversion recovery technique may be used; a spin-echo technique may be used; the position dependence of T2 may be taken into account; the method may be applied to one-dimensional or three-dimensional sections of the sample; the data values may not be time dependent; electromagnetic pulses with frequencies that target nuclei other than the hydrogen nucleus; etc. Thus the scope of the invention should be determined not by the examples given herein, but rather by the appended claims and their legal equivalents.

What is claimed is:

1. A method for producing increased-accuracy object density pixel values $\rho^{**}$ of an object from estimated object density pixel values $\rho^*$, where imaging data values M extracted from said object are related to an integration of an actual object density $\rho$ over a space q weighted by a transform function F, defined by $M=\int F(q)\rho(q)dq$, and said estimated object density $\rho^*$ is related to said imaging data values M by an approximate inverse transform, defined by $\rho^*(q)=\Sigma E(q')M$, so that said estimated object density $\rho^*$ is related to said actual object density $\rho$ by $$\rho^*(q)=\int E(q')F(q)\rho(q')dq'=\int A(q,q')\rho(q')dq',$$

where $A(q,q')=\Sigma E(q')F(q)$ is a kernel function which approximates, but is not equal to, a delta function $\delta(q-q')$, so that values of said actual object density $\rho(q')$ away from $q'=q$ contribute to $\rho^*(q)$, comprising the steps of:

determining entries of a kernel matrix B, where entry (i,j) of said kernel matrix B is related to $\int A(q)dq$, where integration is taken over a spatial grid element centered about position ($q_i$-$q_j$), so said estimated object density $\rho^*$ is approximately related to said actual object density $\rho$ by a matrix equation $\rho^*(q_i)=\Sigma_j B_{ij}\rho(q_j)$;

calculating a reverse matrix G such that multiplication of said reverse matrix G with said kernel matrix B produces a product matrix H, where entry (0, 0) of said product matrix H has an approximate value of unity and all other entries of said product matrix H have an approximate value of zero;

calculating said increased-accuracy object density pixel values $\rho^{**}$ by multiplication of said reverse matrix G with said estimated object density $\rho^*$, defined by $\rho^{**}(q_i)=\Sigma_j G_{ij}\rho^*(q_j)$, whereby linear combinations of said estimated object density $\rho^*$ produce said increased-accuracy object density pixel values $\rho^{**}$.

2. The method of claim 1 wherein said imaging data values M are resonance imaging data.

3. The method of claim 2 wherein said imaging data values M are time dependent data values.

4. The method of claim 3 where said transform function F(q) and said inverse transform function E include sinusoidal time factors.

5. The method of claim 1 wherein said spatial variable q is a two-dimensional spatial variable.

6. The method of claim 1 wherein said imaging data values M are inversion recovery data values.

7. The method of claim 1 wherein said imaging data values M are spin-echo data values.

8. A method for magnetic resonance imaging of an object to provide object density pixel values $\rho^*$ from magnetization data values M extracted from said object over a data acquisition time $t_e$, said magnetization data values M being related to an integration of an actual object density $\rho$ over a space q weighted by a transform function F, defined by $M=\int F(q)\rho(q)dq$, and said estimated object density $\rho^*$ being related to said magnetization data values M by an approximate inverse transform, defined by $\rho^*(q)=\Sigma E(q')M$, so that said estimated object density $\rho^*$ is related to said actual object density $\rho$ by $$\rho^*(q)=\int \Sigma E(q')F(q)\rho(q')dq'=\int A(q,q')\rho(q')dq',$$

where $A(q,q')=\Sigma E(q')F(q)$ is a kernel function, said object having a spin-spin relaxation time $T_2(q)$ which varies with position and a characteristic spin-spin relaxation time $T_2^*$, $$|1-\exp[t_e/T_2(x,y)-t_e/T_2^*]|<<1$$

so that an approximation that said spin-spin relaxation time $T_2(q)$ is equal to said characteristic spin-spin relaxation time $T_2^*$ over said space q may be made.

9. The method of claim 8 wherein said object is a heart.

10. A method for producing increased-accuracy object density pixel values $\rho^{**}$ of an object from estimated object density pixel values $\rho^*$, comprising the steps of:

acquiring imaging data values M related to an integration of an actual object density $\rho$ of said object over a space q weighted by a transform function F, defined by $M=\int F(q)\rho(q)dq$;

computing said estimated object density $\rho^*$ from said imaging data values M by an approximate inverse transform $\rho^*(q)=\Sigma E(q')M$, so that said estimated object density $\rho^*$ is related to said actual object density $\rho$ by $$\rho^*(q)=\int \Sigma E(q')F(q)\rho(q')dq'=\int A(q,q')\rho(q')dq',$$

where $A(q,q')=\Sigma E(q')F(q)$ is a kernel function which approximates, but is not equal to, a delta function $\delta(q-q')$;

determining entries of a kernel matrix B, where entry (i,j) of said kernel matrix B is related to $\int A(q)dq$, where integration is taken over a spatial grid element centered about position ($q_i$-$q_j$), so said estimated object density $\rho^*$ is approximately related to said actual object density $\rho$ by a matrix equation $\rho^*(q_i)=\Sigma_j B_{ij}\rho(q_j)$;

calculating a reverse matrix G such that multiplication of said reverse matrix G with said kernel matrix B produces a product matrix H, where entry (0, 0) of said product matrix H has an approximate value of unity and all other entries of said product matrix H have an approximate value of zero;

calculating said increased-accuracy object density pixel values $\rho^{**}$ by multiplication of said reverse matrix G with said estimated object density $\rho^*$, defined by $\rho^{**}(q_i)=\Sigma_j G_{ij}\rho^*(q_j)$, whereby linear combinations of said estimated object density $\rho^*$ produce said increased-accuracy object density pixel values $\rho^{**}$.

11. A method for producing increased-accuracy object density pixel values $\rho^{**}$ of an object from estimated object density pixel values $\rho^*$, where imaging data values M are related to an integration of an actual object density $\rho$ of said object over an n-dimensional space q weighted by a transform function F, defined by $M=\int F(q)\rho(q)dq$, and said estimated object density $\rho^*$ is related to said imaging data values M by an approximate inverse transform, defined by $\rho^*(q)=\Sigma E(q')M$, so that said estimated object density $\rho^*$ is related to said actual object density $\rho$ by $$\rho^*(q)=\int \Sigma E(q')F(q)\rho(q')dq'=\int A(q,q')\rho(q')dq',$$

where $A(q,q')=\Sigma E(q')F(q)$ is a kernel function which approximates, but is not equal to, a delta function $\delta(q-q')$, so that values of said actual object density $\rho(q')$ away from $q'=q$ contribute to $\rho^*(q)$, comprising the steps of:

determining entries of an n-dimensional kernel tensor B, where entry (i1, i2, . . . , in) of said kernel tensor B is related to $\int A(x1, x2, \ldots xn)\, dx1\, dx2 \ldots dxn$, where integration is taken over a spatial grid element centered about position $(x1_{i1}, x2_{i2}, \ldots, xn_{in})$, so said estimated object density $\rho^*$ is approximately related to said actual object density $\rho$ by a tensor equation $\rho^*(x1_i, x2_j, x3_k, \ldots )=\Sigma_{l,m,n}B_{i-l,\, j-m,\, k-n,\, \ldots}\, \rho(x1_l, x2_m, x3_n, \ldots )$;

calculating an n-dimensional reverse tensor G such that multiplication of said reverse tensor G with said kernel tensor B produces a product tensor H, where entry (0, 0, . . . , 0) of said product tensor H has an approximate value of unity and all other entries of said product tensor H have an approximate value of zero;

calculating said increased-accuracy object density pixel values $\rho^{**}$ by multiplication of said reverse tensor G with said estimated object density $\rho^*$, defined by $\rho^{**}(x1_i, x2_j, x3_k, \ldots )=\Sigma_{l,m,n}G_{i-l,\, j-m,\, k-n,\, \ldots}\, \rho^*(x1_l, x2_m, x3_n, \ldots )$ whereby linear combinations of said estimated object density $\rho^*$ produce said increased-accuracy object density pixel values $\rho^{**}$.

12. An apparatus for producing increased-accuracy object density pixel values $\rho^{**}$ of an object from estimated object density pixel values $\rho^*$, where imaging data values M are related to an integration of an actual object density $\rho$ over space q weighted by a transform function F, i.e., $M=\int F(q)\rho(q)dq$, and said estimated object density $\rho^*$ is related to said imaging data values M by an approximate inverse transform, defined by $\rho^*(q)=\Sigma E(q')M$, so that said estimated object density $\rho^*$ is related to said actual object density $\rho$ by $$\rho^*(q)=\int \Sigma E(q')F(q)\rho(q')dq'=\int A(q,q')\rho(q')dq',$$

where $A(q,q')=\Sigma E(q')F(q)$ is a kernel function which approximates, but is not equal to, a delta function $\delta(q-q')$, so that values of said actual object density $\rho(q')$ away from $q'=q$ contribute to $\rho^*(q)$, comprising:

integrator for determining entries of a kernel matrix B, the (i,j) element of said kernel matrix B being related to the integration of A(q) taken over a spatial grid element centered about position $(q_i\text{-}q_j)$, so said estimated object density $\rho^*$ is approximately related to said actual object density $\rho$ by a matrix equation $\rho^*(q_i)=\Sigma_j B_{ij}\rho(q_j)$;

matrix equation solver for determining a reverse matrix G, multiplication of said reverse matrix G with said kernel matrix B producing a product matrix H, where entry (0,0) of said product matrix H is approximately unity and all other entries of said product matrix H are approximately zero;

matrix multiplier for calculating said increased-accuracy object density pixel values $\rho^{**}$ by multiplication of said reverse matrix G with said estimated object density $\rho^*$, defined by $\rho^{**}(q_i)=\Sigma_j G_{ij}\rho^*(q_j)$, whereby linear combinations of said estimated object density $\rho^*$ produce said increased-accuracy object density pixel values $\rho^{**}$.

13. A method for magnetic resonance imaging of an object having an object density $\rho$ to provide object density pixel values $\rho^*$ by measuring a magnetization M as a function of time t during the application of a continuously-varying magnetic field gradient $q_x$ along an x-axis and continuously-varying magnetic field gradient $q_y$ along an y-axis, so that said magnetization is proportional to an integration over x and y of said object density $\rho$ multiplied by $\exp[if_1\gamma x]$ and $\exp[if_2\gamma y]$, where function $f_1$ is related to an integration over time of $q_x$ and function $f_2$ is related to an integration over time of $q_y$, $T_2$ is a spin-spin relaxation time and $\omega_0$ is a Larmor frequency, so that said object density pixel values $\rho^*$ may be obtained by a summation over samples of the summand sampled at intervals of a sample period $\Delta t$ of said magnetization M(t) multiplied by $\exp[-if_1\gamma x]$ and $\exp[-if_2\gamma y]$, and multiplied by a weighting function W(t) which counteracts a nonuniformity with which said function $f_1(t)$ and said function $f_2(t)$ sample an $f_1$-$f_2$ phase space, and said functions $f_1(t)$ and $f_2(t)$ essentially sample one and only one quadrant of said $f_1$-$f_2$ phase space.

14. The method of claim 13 wherein said functions $f_1(t)$ and $f_2(t)$ are given by $f_1(t)=ct\cos^2 t$, and $f_2(t)=ct\sin^2 t$.

15. The method of claim 14 wherein said weighting function W(t) is given by $W(t)=\pi c^2 t\,|\sin 2t|\,\cos^2(\pi/4)$.

* * * * *